US008577218B2

(12) United States Patent
von Malm et al.

(10) Patent No.: US 8,577,218 B2
(45) Date of Patent: Nov. 5, 2013

(54) ILLUMINATION DEVICE FOR A CAMERA, AND METHOD FOR OPERATING THE SAME

(75) Inventors: Norwin von Malm, Nittendorf-Thumhausen (DE); Jürgen Moosburger, Regensburg (DE); Ulrich Streppel, Regensburg (DE); Michael Brandl, Mintraching (DE); Stefan Morgott, Pentling (DE)

(73) Assignee: OSRAM Opto Semiconductors GmbH (DE)

( * ) Notice: Subject to any disclaimer, the term of this patent is extended or adjusted under 35 U.S.C. 154(b) by 27 days.

(21) Appl. No.: 13/496,920

(22) PCT Filed: Sep. 14, 2010

(86) PCT No.: PCT/EP2010/063465
§ 371 (c)(1),
(2), (4) Date: Apr. 13, 2012

(87) PCT Pub. No.: WO2011/039052
PCT Pub. Date: Apr. 7, 2011

(65) Prior Publication Data
US 2012/0189291 A1    Jul. 26, 2012

(30) Foreign Application Priority Data

Sep. 30, 2009  (DE) .......................... 10 2009 047 788

(51) Int. Cl.
*G03B 15/03* (2006.01)
(52) U.S. Cl.
USPC ............... 396/157; 396/175; 396/182; 362/3; 362/11; 362/16; 362/17; 362/18; 362/544; 362/545

(58) Field of Classification Search
USPC .......... 396/155, 157, 175, 182; 362/3, 14, 19, 362/17, 544, 545, 11, 18
See application file for complete search history.

(56) References Cited

U.S. PATENT DOCUMENTS

| 6,565,247 | B2 | 5/2003 | Thominet ...................... 362/545 |
| 7,046,926 | B2* | 5/2006 | Chikugawa ................... 396/175 |
| 7,136,672 | B2 | 11/2006 | Kitano et al. .............. 455/556.1 |
| 2003/0174499 | A1 | 9/2003 | Bohlander ..................... 362/240 |
| 2005/0073849 | A1 | 4/2005 | Rhoads et al. ................ 362/296 |
| 2005/0168965 | A1 | 8/2005 | Yoshida ........................... 362/3 |
| 2006/0081773 | A1 | 4/2006 | Rains, Jr. et al. ............. 250/228 |
| 2007/0097681 | A1* | 5/2007 | Chich et al. ................... 362/232 |
| 2008/0151052 | A1* | 6/2008 | Erel et al. ....................... 348/143 |
| 2010/0289035 | A1* | 11/2010 | Muschaweck et al. ......... 257/84 |
| 2011/0266576 | A1* | 11/2011 | Engl et al. ........................ 257/98 |
| 2011/0317414 | A1* | 12/2011 | Marfeld et al. ............... 362/235 |

(Continued)

FOREIGN PATENT DOCUMENTS

| DE | 100 09 782 A1 | 9/2001 |
| DE | 103 21 930 A1 | 12/2003 |

(Continued)

*Primary Examiner* — Clayton E Laballe
*Assistant Examiner* — Warren K Fenwick
(74) *Attorney, Agent, or Firm* — DLA Piper LLP (US)

(57) ABSTRACT

An illumination device contains a light-emitting semiconductor chip containing a plurality of individually drivable emission regions. The illumination device furthermore contains an optical element designed to shape light emitted by the emission regions to form a beam of rays. The illumination device is designed such that different beam profiles of the beam of rays can be set by the individually drivable emission regions.

16 Claims, 6 Drawing Sheets

(56) References Cited

U.S. PATENT DOCUMENTS

2012/0114321 A1* 5/2012 Brandl et al. .............. 396/106
2012/0155846 A1* 6/2012 Gilbert-Schachter
 et al. ............................ 396/106
2012/0162783 A1* 6/2012 Bemmerl et al. ............ 359/707
2012/0193657 A1* 8/2012 Von Malm et al. ............ 257/89

FOREIGN PATENT DOCUMENTS

| | | |
|---|---|---|
| EP | 1 568 255 B1 | 8/2005 |
| JP | 2003-098580 A | 4/2003 |
| JP | 2008-084600 A | 4/2008 |
| WO | 2009/059461 A1 | 5/2009 |

* cited by examiner

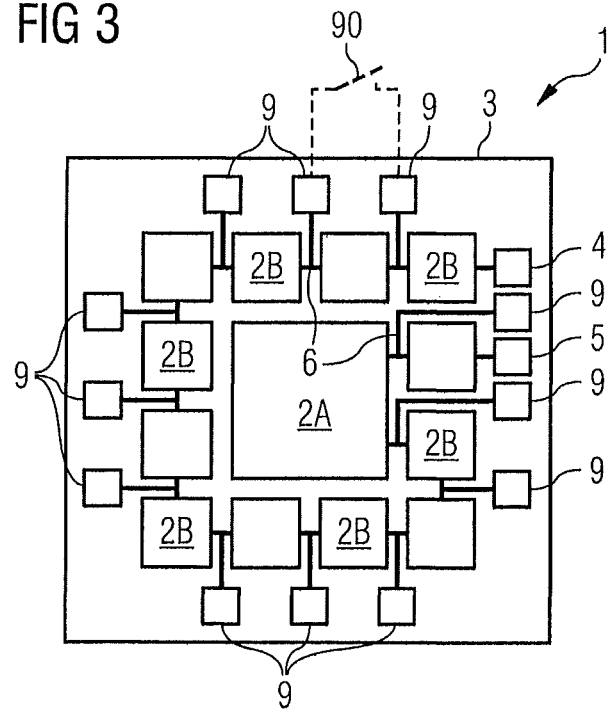
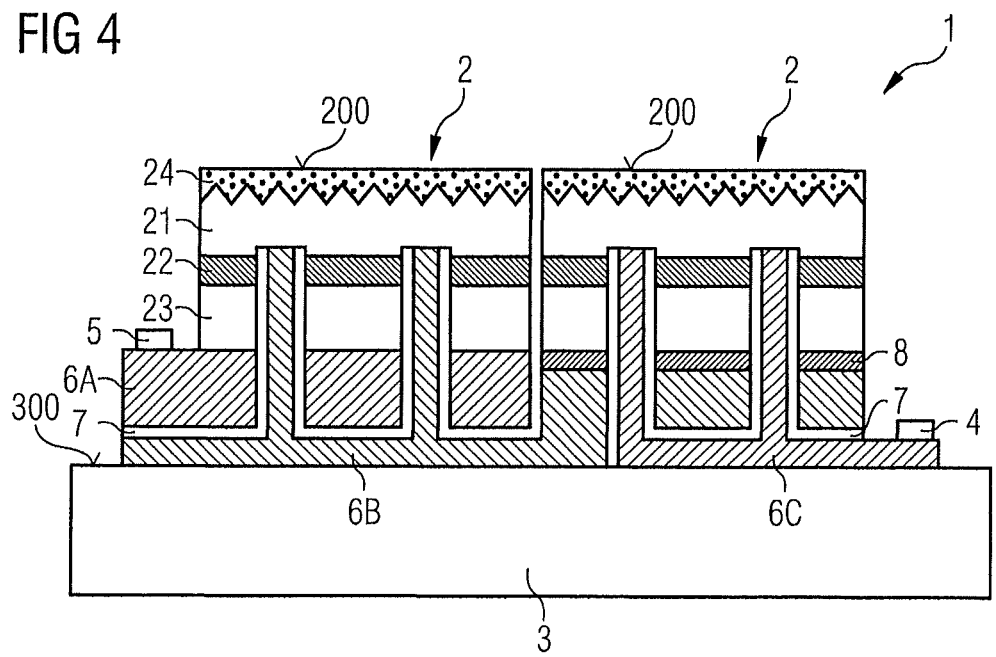

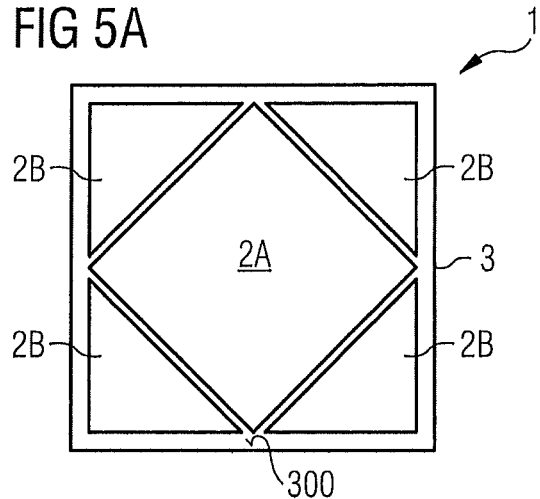
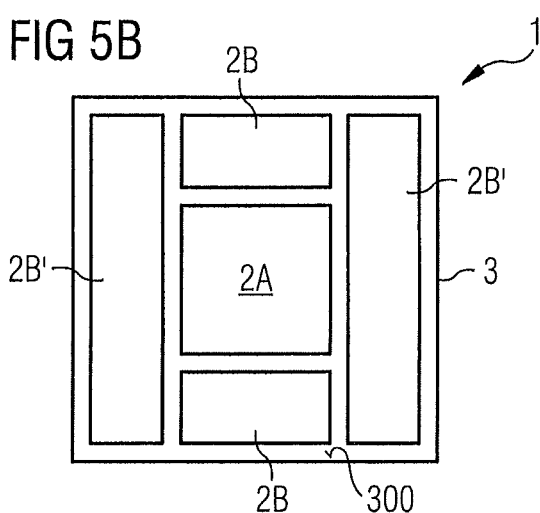
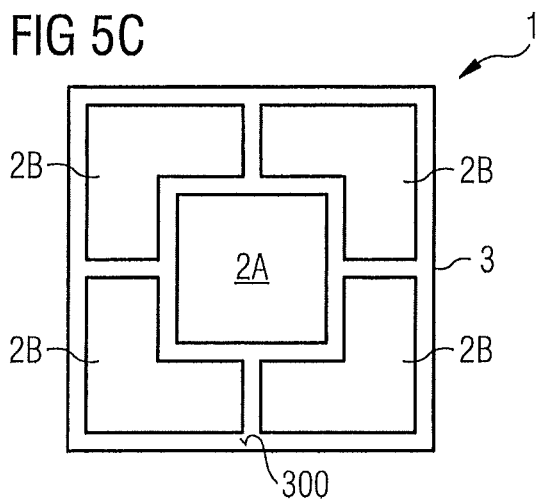

ILLUMINATION DEVICE FOR A CAMERA, AND METHOD FOR OPERATING THE SAME

RELATED APPLICATIONS

This is a §371 of International Application No. PCT/EP2010/063465, with an international filing date of Sep. 14, 2010 (WO 2011/039052 A1, published Apr. 7, 2011), which is based on German Patent Application No. 10 2009 047 788.8, filed Sep. 30, 2009, the subject matter of which is incorporated by reference.

TECHNICAL FIELD

This disclosure relates to a light-emitting semiconductor chip for an illumination device, an illumination device for a camera, a camera, a method for operating the illumination device, and a method for operating the camera.

BACKGROUND

Cameras with conventional flashlights have the disadvantage that the flashlights have a defined emission characteristic. It can thus happen that, in the case of an image recorded by the camera, a motif situated in the foreground is overexposed, while the background illumination may be insufficient. One possibility for solving this problem would be to record an image sequence of images exposed to different extents and to superimpose them computationally. This makes high requirements of the storage capacity and computing power of the camera and causes a high current consumption, which is disadvantageous particularly in the case of battery-operated devices such as cameras.

JP 2008-084600 A discloses a flashlight for a camera of a mobile telephone in which the position of an LED in a reflector can be changed by a servomotor. In this way, the region illuminated overall by the flashlight can be better matched to the image excerpt. The fundamental problem of possible overexposure of a motif in the foreground remains unresolved, however, in the case of this flashlight. Moreover, a flashlight of this type is technically complicated and, for example, on account of the moving parts, susceptible to faults. It is expensive and has a high current consumption.

Therefore, it could be helpful to provide an illumination device with which a predefined solid angle range, in particular a solid range to be imaged by a camera, can be variably illuminated in a simple manner.

SUMMARY

We provide an illumination device for a camera including a light-emitting semiconductor chip including a plurality of individually drivable emission regions and an optical element that shapes light emitted by the emission regions to form a beam of rays, wherein different beam profiles of the beam of rays can be set by the individually drivable emission regions.

We also provide a method for operating the illumination device, including operating the illumination device with a first beam profile and subsequently with a second beam profile different from the first beam profile, wherein the emission regions are driven such that, during operation with the first beam profile, a first emission region emits light and a second emission region is turned off and, during operation with the second beam profile, the second emission region emits light and the first emission region emits light or is turned off.

We further provide an illumination device for a camera including a light-emitting semiconductor chip and an optical element, wherein the semiconductor chip has a semiconductor layer sequence containing an active zone provided to generate light and an electrical contact on the semiconductor layer sequence, the light-emitting semiconductor chip has a plurality of individually drivable emission regions, the emission regions are defined by a structuring of at least one of the electrical contact and the semiconductor layer sequence, the optical element shapes light emitted by the emission regions to form a beam of rays, and the illumination device sets different beam profiles of the beam of rays by the individually drivable emission regions.

BRIEF DESCRIPTION OF THE DRAWINGS

FIG. 3 shows a schematic plan view of a light-emitting semiconductor chip for an illumination device in accordance with a third example, FIG. 4 shows a schematic cross section through a light-emitting semiconductor chip in accordance with one variant of the first example, FIG. 5A shows a schematic plan view of a light-emitting semiconductor chip for an illumination device in accordance with a fourth example, FIG. 5B shows a schematic plan view of a light-emitting semiconductor chip for an illumination device in accordance with a fifth example, FIG. 5C shows a schematic plan view of a light-emitting semiconductor chip for an illumination device in accordance with a sixth example.

DETAILED DESCRIPTION

Figure 1:
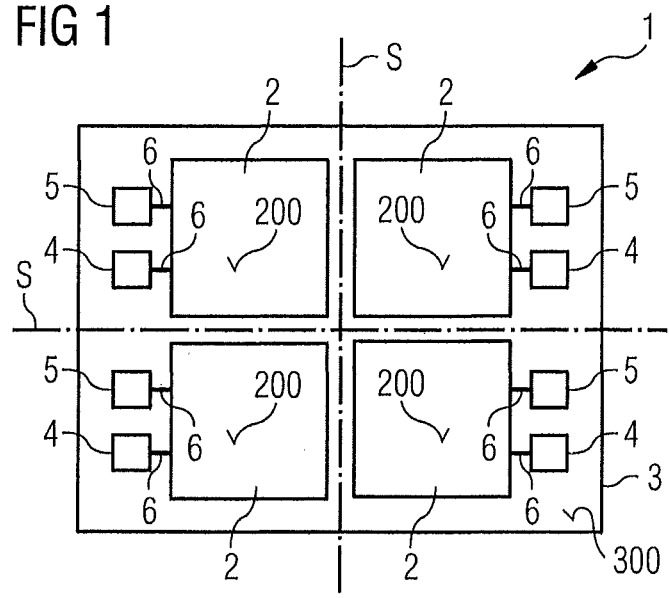
FIG. 1 shows a plan view of a light-emitting semiconductor chip for an illumination device in accordance with a first example.

We provide a light-emitting semiconductor chip of an illumination device. The semiconductor chip expediently contains a semiconductor layer sequence having an active zone provided for generating light. The active zone has, in particular, a pn-junction, a double heterostructure, a single quantum well structure and/or a multiple quantum well structure for generating radiation.

The semiconductor chip contains a plurality of individually drivable emission regions. In particular, the emission regions can be operated independently of one another. In the emission regions, electromagnetic radiation can be generated at identical or different times. Furthermore, the emission regions can be energized with different current intensities, such that the emission regions can generate electromagnetic radiation with mutually different intensities. Preferably, the individually drivable emission regions can be switched on and off independently of one another. The emission regions can have active zones formed in identical fashion such that the electromagnetic radiation generated in the emission regions in each case has the same spectral distribution.

The emission regions can be produced, for example, by structuring an electrical contact of the light-emitting semiconductor chip. That contact which has the poorer transverse conductivity is preferably structured in this case. The emission regions can then comprise a common active zone extending laterally through all the emission regions, such that the active zones of the emission regions are constructed in identical fashion.

Structuring the contact may be realized by complete absence of the contact at the locations between the emission regions. Alternatively, it is possible for locations having a high contact resistance to be present between the emission regions, the locations leading to an electrical decoupling of the emission regions. The structured electrical contact is formed, for example, by an, in particular segmented, metal layer applied to the semiconductor layer sequence.

Alternatively or additionally, the semiconductor layer sequence of the light-emitting semiconductor chip which contains the emission regions may be structured for the purpose of forming the emission regions. For example, the active zone is severed for the purpose of forming the individual emission regions. For this purpose, it is possible to form trenches in the semiconductor layer sequence between the emission regions, for instance by a sawing and/or etching process.

With segmentation of the contact and/or of the semiconductor layer sequence of an individual semiconductor chip to form the emission regions, the emission regions can be arranged within a particularly small luminous field. Particularly small structural sizes of the illumination device can advantageously be obtained in this way.

At least one of the emission regions may have a luminescence conversion element which can be applied to the semiconductor layer sequence, for example. The active zone of an emission region with a luminescence conversion element is expediently provided to generate electromagnetic primary radiation. The luminescence conversion element is designed, in particular, for absorption of primary radiation from the active zone and emission of secondary radiation. An intensity maximum of the secondary radiation is preferably shifted spectrally towards higher wavelengths in comparison with an intensity maximum of the primary radiation. For example, the intensity maximum of the primary radiation lies in the blue spectral range and the intensity maximum of the secondary radiation lies in the yellow spectral range. In one configuration, the emission region and/or the semiconductor chip are/is designed to emit mixed light composed of the primary radiation and the secondary radiation, for example, white light.

The emission regions can be arranged such that all emission regions bring about the same color impression. For example, all the emission regions are designed to emit light with a chromaticity coordinate in the white region of the CIE standard chromaticity diagram. Alternatively, at least two of the emission regions can differ with regard to the chromaticity coordinate of the light emitted by the respective emission region. For example, a first emission region emits light having a first chromaticity coordinate in the CIE standard chromaticity diagram. A second emission region has a second chromaticity coordinate, which is different from the first chromaticity coordinate, in the CIE standard chromaticity diagram.

The light-emitting diode chip may comprise at least two differently configured luminescence conversion elements to obtain the different color loci. For example, the differently configured luminescence conversion elements are assigned to different emission regions which are designed to emit different-colored mixed light by the differently configured luminescence conversion elements. In this case, "differently configured" means, in particular, that the luminescence conversion elements, if electromagnetic radiation having the same wavelength and the same intensity radiates through them, emit mutually different secondary radiation. For example, the conversion elements can differ from one another with regard to their geometrical dimensions such as their thickness, for example, and/or their composition. For example, a first conversion element can contain a first phosphor, while the second conversion element contains a second phosphor.

Each emission region may have an emission area for the coupling-out of light at a front side of the semiconductor chip. The semiconductor chip is expediently provided for coupling out light from its front side. Each emission region is assigned two conductor tracks of the semiconductor chip for the electrical connection of the respective emission region. For example, one of the conductor tracks is designed for the n-side contact-connection of the emission region and the other conductor track is designed for the p-side contact-connection of the emission region. The respective emission areas preferably cover the conductor tracks assigned to the respective emission region in a plan view of the front side. In particular, the conductor tracks are accordingly covered by a front-side main area of the semiconductor layer sequence.

A particularly large emission area of the emission regions can advantageously be obtained in this way. In particular, the front-side main area of the semiconductor layer sequence is free of electrical connection areas such as bonding pads. In a plan view of the front side it is also the case, in particular, that no bonding wires or conductor tracks are drawn over the front-side main area of the semiconductor layer sequence. Both the n-side contact-connection and the p-side contact-connection of the semiconductor layer sequence are advantageously effected from a rear-side main area of the semiconductor layer sequence.

Each emission region can be assigned a separate cathode connection region and a separate anode connection region for the external electrical contact-connection of the semiconductor chip. In accordance with another configuration, at least two emission regions are connected in series. All the emission regions may be connected in series. In this case, all the emission regions are electrically connected jointly by two electrode connection regions, namely a common cathode connection region and a common anode connection region. In particular, the semiconductor chip has exactly two electrode connection regions for the external electrical contact-connection of the semiconductor chip, namely the common cathode connection region and the common anode connection region.

The semiconductor chip may have two external connection zones which can be electrically conductively connected for the purpose of bridging an emission region, in particular exactly one emission region. For example, a first one of the external connection zones is connected to a first one of the conductor tracks assigned to the emission region and the second external electrical connection zone is connected to the second conductor track assigned to the emission region. In particular, the semiconductor chip is connected up such that an electrical or electronic element, for example, a resistor, a transistor or a switch which is connected to the two external connection zones, is connected in parallel with the emission region. In this way, the emission region can be short-circuited, for example, by the switch or transistor. In one configuration, each emission region is assigned a pair of external connection zones which can be electrically conductively connected for the purpose of bridging the respective emission region.

A configuration with emission regions that can be bridged is expedient, in particular, if at least two emission regions are connected in series. By the external connection zones, the emission regions are advantageously individually drivable even though they are connected in series.

At least two emission regions, in particular all emission regions, may be electrically connected in parallel with one another. The emission regions connected in parallel with one another have, for example, a common cathode connection region for external electrical connection. Each of the emission regions connected in parallel is assigned a separate anode connection region for external electrical connection. A configuration with separate cathode connection regions and a common anode connection region is also conceivable.

The electrical interconnection of the emission regions may be performed by electrical connecting elements arranged partly or completely on a rear-side main area of the semiconductor layer sequence. For example, the electrical connecting elements with which the emission regions are connected in particular in series and/or in parallel comprise conductor tracks or they consist of conductor tracks. Preferably, the electrical connecting elements comprise the conductor tracks which are provided for p-side and n-side contact-connection and covered at least in regions in particular by the emission areas. The conductor tracks or at least segments of the conductor tracks are preferably applied on the rear-side main area of the semiconductor layer sequence.

For example, an electrical connecting element, for instance a conductor track, runs from one emission region to a further emission region, in particular to interconnect these emission regions. A segment of the electrical connecting element arranged between the two emission regions in a plan view of the front side can be completely covered by the semiconductor layer sequence or—for example, if the active layer is severed to form the emission regions—not be covered by the semiconductor layer sequence, and in particular can be exposed.

The semiconductor chip may contain a carrier body which is different in particular from the growth substrate of the semiconductor layer sequence and to which the semiconductor layer sequence is connected in a mechanically stable manner. The rear-side main area of the semiconductor layer sequence expediently faces the carrier body. In the case of this development, the electrical connecting elements are arranged, for example, between the semiconductor layer sequence and the carrier body.

The electrical interconnection of the emission regions and/or the electrical connection of the emission regions to the electrode connection regions, that is to say to the cathode connection region(s) and to the anode connection region(s), and also, if appropriate, to the external connection zones, can advantageously be effected inexpensively and reliably in the chip production process. For example, the conductor tracks can be produced by a deposition method, for instance a vapor deposition or sputtering method, on the semiconductor layer sequence and/or on the carrier body. Subsequent interconnection of the individual emission regions, for example, with the aid of bonding wires, is advantageously not necessary.

The electrode connection regions and, if appropriate, the external electrical connection zones may be arranged at the front side of the semiconductor chip. For example, they are arranged in a marginal region between the emission regions and the outer edges of the semiconductor chip in a plan view of the front side of the semiconductor chip. The electrode connection regions and/or the external connection zones can also be arranged at a rear side of the semiconductor chip lying opposite the front side.

A first emission region may be laterally enclosed by at least one further emission region or laterally surrounded by a plurality of further emission regions. For example, the emission area of the first emission region is arranged in a central region of the front side in a plan view of the front side of the semiconductor chip. The emission areas of the further emission regions are arranged around this first emission area, in particular in a marginal region of the front side, and/or a further emission area laterally encloses the first emission area. For example, at least four emission regions are arranged around the first emission region in a ring-like manner. For example, in a plan view of the front side, one of the further emission regions is positioned between the first emission region and an edge or corner of the semiconductor chip. In one configuration, in a plan view of the front side, the emission regions are arranged mirror-symmetrically with respect to the median lines of the outer edges of the semiconductor chip and/or have a four-fold rotational symmetry with regard to the surface normal with respect to the front side.

We also provide an illumination device, in particular an illumination device for a camera. The illumination device may be a flashlight.

The illumination device contains a light-emitting semiconductor chip. The light-emitting semiconductor chip is, for example, in accordance with at least one of the configurations described above.

For example, the illumination device has a luminous field containing the emission regions of the light-emitting semiconductor chip. Different luminance distributions of the luminous field can preferably be set by individually drivable emission regions.

The illumination device preferably has an optical element designed to shape light emitted by the semiconductor chip to form a beam of rays. In particular, the optical element is designed to shape light emitted by the emission regions of the light-emitting semiconductor chip to form the beam of rays.

The optical element can be a lens, for example. The lens is a spherical lens, an aspherical lens, or a cylindrical lens, for example. The lens can also be a so-called free-form lens. The free-form lens is shaped, for example, such that it directs the light from the individual emission regions in different, but predetermined directions. Preferably, the free-form lens has a light entrance area and/or light exit area that are/is smooth, i.e., free of bends and edges.

The illumination device may have different beam profiles of the beam of rays that can be set by individually drivable emission regions. For example, the beam profiles differ with regard to the spatial intensity distribution and/or the spatial chromaticity coordinate distribution in a—in particular arbitrary—plane perpendicular to a central axis of the beam of rays.

An aperture angle of the beam of rays can be set by individually drivable emission regions. This configuration is expedient, for example, if the beam of rays is a divergent beam of rays.

The position of a focal point to which the beam of rays is focussed by the optical element can be set by individually drivable emission regions. Such a configuration is expedient, in particular, if the illumination device emits a convergent beam of rays from a light-coupling out area of the optical element.

Shaping the optical element and arrangement of the optical element with respect to the emission regions are adapted to one another such that the illumination device is designed to direct light emitted by a first emission region into a first emission angle range and direct light emitted by a second emission region, different from the first emission region, into a second emission angle range different from the first emission angle range. For example, the first emission angle range contains the central axis of the beam of rays and the second emission angle range is spaced apart from the central axis of the beam of rays.

With the individually drivable emission regions, a first beam profile can be set in which the radiation intensity of the beam of rays has a local minimum following the central axis of the beam of rays and the radiation intensity firstly rises and subsequently falls again in at least one—preferably every—direction perpendicular to the central axis in the course away from the central axis. For example, the beam of rays has the maximum radiation intensity in a ring-like region extending around the central axis, for instance in an overlap region of the first emission angle range and of the second emission angle range.

Preferably, a second beam profile can be set by individually drivable emission regions in which profile the radiation intensity is maximal from the central axis. In particular, the radiation intensity falls proceeding from the central axis in every direction perpendicular to the central axis in the course away from the central axis.

We further provide an illumination device for a camera, wherein the illumination device comprises a light-emitting semiconductor chip which contains a plurality of individually drivable emission regions, and comprises an optical element designed to shape light emitted by the emission regions to form a beam of rays. The illumination device may have different beam profiles of the beam of rays that can be set by individually drivable emission regions.

With an illumination device of this type—in particular the separate driving of the individual emission regions—a solid angle range imaged by the camera can be illuminated in a manner differentiated temporally and/or spatially in all three spatial directions. In this case, it is advantageously possible that both the intensity and the wavelength of the light can be set spatially and/or temporally.

In this case, it is advantageously possible to dispense with moveable components in the illumination device. For example, the optical element is arranged in a stationary manner with respect to the light-emitting semiconductor chip. The illumination device is advantageously particularly robust in this way. Moreover, a particularly low energy consumption of the illumination device can be achieved, for example, since it is not necessary to operate servomotors to move individual components of the illumination device relative to one another.

The illumination device may have a storage unit. In the storage unit, a plurality of different driving patterns to drive the emission regions and set the different beam profiles are stored and can be retrieved during the operation of the illumination device.

The illumination device may have a control unit. The control unit can be designed, for example, to produce an electrically conductive connection between two external connection zones for the purpose of setting a first beam profile, which connection zones can be electrically conductively connected for the purpose of bridging an emission region. For the purpose of setting a second beam profile, the control unit can be provided for interrupting the electrically conductive connection. Alternatively or additionally, the control unit can be designed to feed current to the electrode connection regions. For example, the control unit is an IC component (IC=integrated circuit).

The illumination device may have a carrier. The semiconductor chip, in particular the rear side of the semiconductor chip, can be fixed to the carrier. The carrier can be a circuit board. For example, the electrode connection regions and, if appropriate, the external connection zones are electrically connected to connection conductors of the circuit board. External connection zones and/or electrode connection regions arranged at the rear side of the semiconductor chip, for example, can be areally connected, in particular soldered or adhesively bonded, to the connection conductors. Further electronic components, e.g., the storage unit or the control unit, can be arranged on the circuit board.

We still further provide a camera containing an illumination device. The camera is designed, for example, to record images and/or image sequences. For example, the camera is a photographic camera and/or video camera. The camera can be contained in a mobile telephone. The camera can have a release mechanism for starting the recording. The camera has, for example, a detector, for instance a CCD detector (CCD=charge coupled device), for detecting the images.

The emission spectrum of the emission regions can be coordinated with the spectral sensitivity of the detector. In this case, the illumination device can also be provided for the spatially and temporally invariant emission of different-colored light to achieve a particularly low energy consumption of the camera.

We still further provide a method for operating the illumination device or for operating the camera comprising the illumination device. In the method, the illumination device is operated first with a first beam profile and subsequently with a second beam profile, different from the first beam profile.

The emission regions may be driven such that during operation with the first beam profile, a first emission region emits light and a second emission region is turned off. During operation with the second beam profile, the second emission region preferably emits light. The first emission region can likewise emit light or be turned off while the illumination device is operated with the second beam profile.

We yet further provide a method for operating the camera for recording an image sequence. In the method, the camera records a first image while the illumination device is operated with the first beam profile. While the illumination device is operated with the second beam profile, the camera records a second image.

After the first and the second image have been recorded, one of the two images may be selected. The other image can be erased, for example. The selection can be effected by image recognition software, in particular automatically, or by the user.

We also provide a method for operating the camera for recording an image. The method involves first actuating the release mechanism for the time shift triggering of the detection of the image by the detector. The illumination device is subsequently operated with the first beam profile. After operation with the first beam profile, the illumination device is operated with the second beam profile. In this case, the operation of the illumination device with the first beam profile takes place, in particular, before the detection of the image by the detector. Operation of the illumination device with the second beam profile preferably temporally overlaps the detection of the image by the detector. In particular, the illumination device is operated with the second beam profile while the detector detects the image.

The illumination device may be driven for operation with the first beam profile such that only one or only some of the emission regions emit light. The emission regions can be selected, for example, such that the beam of rays emitted by the illumination device is spatially delimited to a central region of that solid angle range imaged by the camera onto the image. For example, the beam of rays can be spatially delimited to an autofocus range of the camera. Operation of the illumination device with the first beam profile can involve, for example, a pre-flash for instance for reducing the so-called "red eye" effect.

For operation of the illumination device with the second beam profile, different emission regions from those for operation with the first beam profile or all emission regions can be driven such that they emit light. For example, operation of the illumination device with the second beam profile involves a main flash.

With one or a few emission regions for the pre-flash it is advantageously possible to achieve a particularly low energy consumption of the illumination device for recording the image.

Further advantages and advantageous configurations and developments will become apparent from the following examples elucidated in association with the figures.

In the examples and figures, identical, similar or similarly acting constituent parts are provided with the same reference symbols. The figures and the size relationships of the elements illustrated in the figures among one another should not be regarded as true to scale. Rather, individual elements may be illustrated with an exaggerated size to facilitate depictability and/or comprehensibility.

FIG. 1 shows a schematic plan view of a front side of a semiconductor chip 1 for an illumination device in accordance with a first example.

The light-emitting semiconductor chip 1 has a plurality of emission regions 2. Each emission region has an emission area 200 which faces the front side and which is provided for coupling out radiation from the respective emission region 2. In this case, the semiconductor chip 1 has four emission regions 2 arranged mirror-symmetrically with respect to the median lines S of the edges of the semiconductor chip 1 in a plan view of the front side of the semiconductor chip 1. In this case, the arrangement of the emission regions 2 also has a four-fold rotational symmetry with regard to an axis of rotation running in the direction of the surface normals to the emission areas and through the point of intersection of the two median lines S.

The semiconductor chip 1 comprises a carrier body 3 on which the emission regions 2 are arranged. For example, the carrier body 3 can be a growth substrate on which an epitaxial semiconductor layer sequence containing the emission regions 2 is grown during the production of the semiconductor chip 1. However, the light-emitting semiconductor chip 1 is a so-called "thin-film" light-emitting diode chip in which the growth substrate is removed from the epitaxial semiconductor layer sequence or greatly thinned and the semiconductor layer sequence is fixed on a carrier substrate 3 different from the growth substrate.

The front-side main area 300 of the carrier body 3 has electrode connection regions for the external electrical contact-connection of the emission regions 2. In the case of the semiconductor chip 1 in accordance with the first example, each of the emission regions 2 is assigned two separate electrode connection regions, mainly a cathode connection region 4 and an anode connection region 5.

From the respective electrode connection regions 4, 5, conductor tracks 6 are drawn under the respective emission regions 2. The respective emission areas 200 cover the conductor tracks 6. In this way, the emission regions 2 are electrically connected from a rear side lying opposite the front side. The emission areas 200 are advantageously free of electrode connections such as bonding pads.

FIG. 4 shows a schematic cross section through a light-emitting semiconductor chip for an illumination device in accordance with one variant of the first example. The example in FIG. 4 differs from the first example in that not every one of the emission regions 2 is assigned two separate electrode connections 4, 5. Rather, two emission regions are respectively connected in series.

The emission regions 2 each have an n-conducting semiconductor layer 21 and a p-conducting semiconductor layer 23 between which is arranged an active layer 22 provided by a pn-junction, a double heterostructure, a single quantum well structure or a multiple quantum well structure for generating radiation.

A first conductor track 6A is drawn from the anode connection region 5 under one of the emission regions 2. For example, the p-conducting layer 23 is electrically connected by the conductor track 6A. A second conductor track 6B extends in a manner proceeding from the n-conducting layer 21 in the direction of the rear side of the semiconductor chip 1—that is to say away from the emission area 200—through the active layer 22 and the p-conducting layer 23. In this case, the second conductor track 6B also runs through the first conductor track 6A in the direction towards the rear side.

In the first example in FIG. 1, the second conductor track 6B is exposed laterally with respect to the emission region 2 assigned to it and can be electrically connected by the cathode connection region 4. In the case of this variant, by contrast, the second conductor track 6B is drawn under a further emission region 2 to electrically connect the p-conducting layer 23 of this emission region. Instead, a third conductor track 6C extends from the n-conducting layer 21 of the further emission region 2 through the active layer 22, the p-conducting layer 23 and the second conductor track 6B in the direction of the rear side of the semiconductor chip 1 and is drawn laterally alongside the emission regions 2, where it can be electrically connected by the cathode connection region 4.

The second conductor track 6B is electrically insulated from the first conductor track 6A and the third conductor track 6C by an electrically insulating layer, e.g., a dielectric layer 7. A reflector layer 8 can be arranged between the p-conducting layers 23 of the two emission regions 2 and the first conductor track 6A and the second conductor track 6B, respectively, which makes electrical contact with the respective p-conducting layer 23. The reflector layer 8 can be formed by a metallic layer. Alternatively, the reflector layer 8 can comprise a dielectric layer containing openings through which the respective conductor track 6A, 6B extends through the dielectric layer as far as the p-conducting layer 23.

The emission regions can comprise a luminescence conversion element 24, depending on the desired chromaticity coordinate. A front-side main area of the emission regions 2 can be structured to improve the coupling-out of light.

Figure 2:
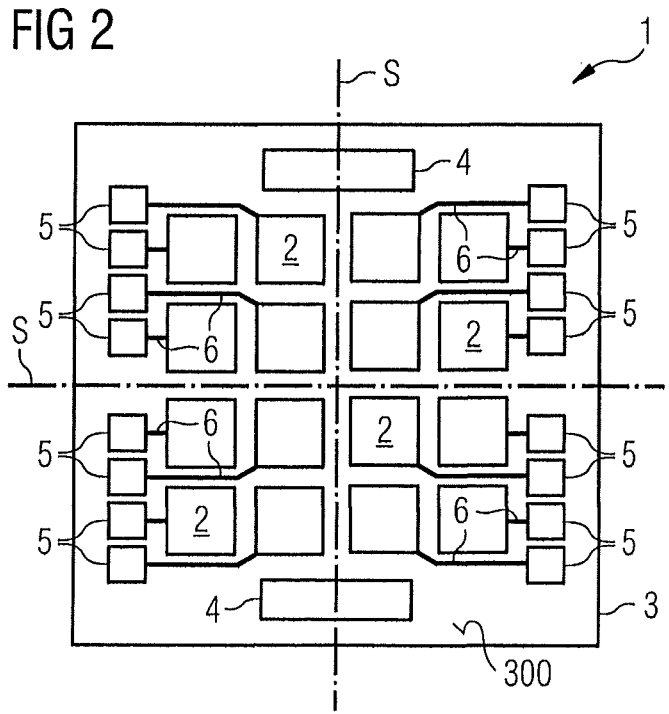
FIG. 2 shows a schematic plan view of a light-emitting semiconductor chip for an illumination device in accordance with a second example.

FIG. 2 shows a schematic plan view of a light-emitting semiconductor chip 1 for an illumination device in accordance with a second example.

The semiconductor chip in accordance with FIG. 2 differs from that in the first example in that it has sixteen emission regions 2. As in the case of the semiconductor chip in accordance with FIG. 1, the emission regions are arranged mirror-symmetrically with respect to the median lines S of the outer edges of the carrier substrate 3. In particular, the emission regions 2 are arranged at the grid points of an imaginary rectangular—in the present case square—grid.

In contrast to the semiconductor chip in the first example, not every emission region is assigned a pair of electrode connections 4, 5. Although each emission region 2 is assigned a separate anode connection 5, the emission regions 2 are connected to a common cathode connection, for which two cathode connection regions 4 are provided in the case of the semiconductor chip in the second example. In this case, the routing of the conductor tracks 6 from the anode connections 5 to the respective emission regions 2 can be effected in a manner analogous to the configuration explained in association with FIG. 4.

FIG. 3 shows a schematic plan view of the front side of a semiconductor chip 1 for an illumination device in accordance with a third example.

The semiconductor chip in accordance with the third example has a first emission region 2A, arranged centrally on the carrier body 3 in a plan view of the front side of the semiconductor chip 1. In a lateral direction, the first emission region 2A is surrounded by twelve further emission areas 2B. The further emission regions 2B are arranged at the edges and corners of an imaginary rectangle extending around the first emission region 2A. The further emission regions are arranged such that one of the emission regions 2B is arranged on each corner of the imaginary rectangle and in each case two emission regions 2B are arranged on each edge between the corners. Consequently, the emission regions 2B surround the first emission region 2A in a chain-like manner.

In this example, all the emission regions 2A, 2B are electrically connected in series by the conductor tracks 6. The semiconductor chip 1 has exactly one cathode connection region 4 and exactly one anode connection region 5. The electrical connection in series can be arranged analogously to the configuration explained in association with FIG. 4.

In the case of the semiconductor chip 1 in accordance with the third example, each of the emission regions 2A, 2B is assigned a pair of external connection zones 9 by which the respective emission region 2A, 2B can be electrically bridged. For example, an emission region 2A, 2B can be electrically bridged by the two electrical connection zones 9 that are assigned to it being electrically conductively connected. For example, a control unit 90 can be provided, which is designed to produce and to interrupt an electrically conductive connection between the two connection zones of a pair of external electrical connection zones. This is indicated in FIG. 3 by the dashed lines 90 for one of the pairs of external connection zones 9.

Alternatively or additionally, the control unit can be designed to supply the semiconductor chip with an operating current by the electrode connection regions 4, 5. In this case, the control unit can be designed to set a supply voltage depending on the number of bridged emission regions 2A, 2B.

FIG. 5A shows a fourth example of a light-emitting semiconductor chip for an illumination device in a schematic plan view of the front side of the semiconductor chip 1.

As in the case of the third example, a first emission region 2A is surrounded by a plurality of further emission regions 2B. In this example, the rectangular, in particular square, first emission region 2A is arranged on the rectangular, in particular square, carrier body 3 such that in a plan view of the front side, the edges of the first emission region 2A are rotated by 45° relative to the edges of the carrier body 3. In particular, the median lines of the edges of the carrier body 3 run through the corners of the first emission region 2A.

The further emission regions 2B are arranged in triangular fashion in a plan view of the front side. In particular, the emission areas each have a triangular outer contour. The outer contour preferably has the form of an isosceles right-angled triangle.

A further emission region 2B is in each case arranged between an edge of the first emission region 2A and a corner of the carrier body 3. In particular, the hypotenuse of the triangle defined by the emission area 200 of the further emission region 2B faces the edge of the first emission region 2A and has, in particular, the same length as the edge. The corner which is formed by the two catheti and which forms the right angle faces, in particular, the corner of the carrier body 3.

FIG. 5B shows a schematic plan view of a light-emitting semiconductor chip for an illumination device in accordance with a fifth example.

In this example, too, in a plan view of the front side, the first emission region 2A is surrounded by two second emission regions 2B and two third emission regions 2B'. In contrast to the previous example, in this case the edges of the first emission region 2A are parallel to the edges of the carrier body 3.

In a direction from one of the edges of the carrier body 3 to the opposite edge of the carrier body 3, one of the second emission regions 2B, the first emission region 2A and a further one of the second emission regions 2B succeed one another in this order. Perpendicularly to this direction, these three emission regions 2A, 2B are arranged between the third emission regions 2B'. The latter can be arranged in strip form, for example, and extend, in particular, substantially over the entire edge length of the semiconductor chip. Perpendicularly to the direction in which they succeed one another, the first and the second emission regions 2A, 2B preferably have the same dimensioning in a plan view of the front side.

FIG. 5C shows a schematic plan view of the front side of a semiconductor chip 1 for an illumination device in accordance with a sixth example.

In the case of the semiconductor chip 1 in accordance with the sixth example, once again a first emission region 2A is arranged in a central region of the front-side main area 300 of the carrier body 3 and enclosed by further emission regions 2B. In this case, the further emission regions 2B are arranged in L-shaped fashion in a plan view of the front side and are arranged such that a corner of the first emission region 2A is in each case arranged in the hollow groove formed by the L.

In the examples in FIGS. 5A, 5B and 5C, the electrode connection regions 4, 5 are not arranged at the front-side main area 300 of the carrier body 3, but rather at the rear side thereof. The semiconductor chips in accordance with these examples are therefore provided for electrical connection from the rear side of the semiconductor chip 1, while the semiconductor chips 1 in accordance with the first three examples are provided for electrical connection from the front side of the semiconductor chip 1. However, the semiconductor chips are not restricted to this example of the contact-connection. Rather, each of the semiconductor chips can be adapted for electrical connection from the rear side and/or from the front side.

Figure 6:
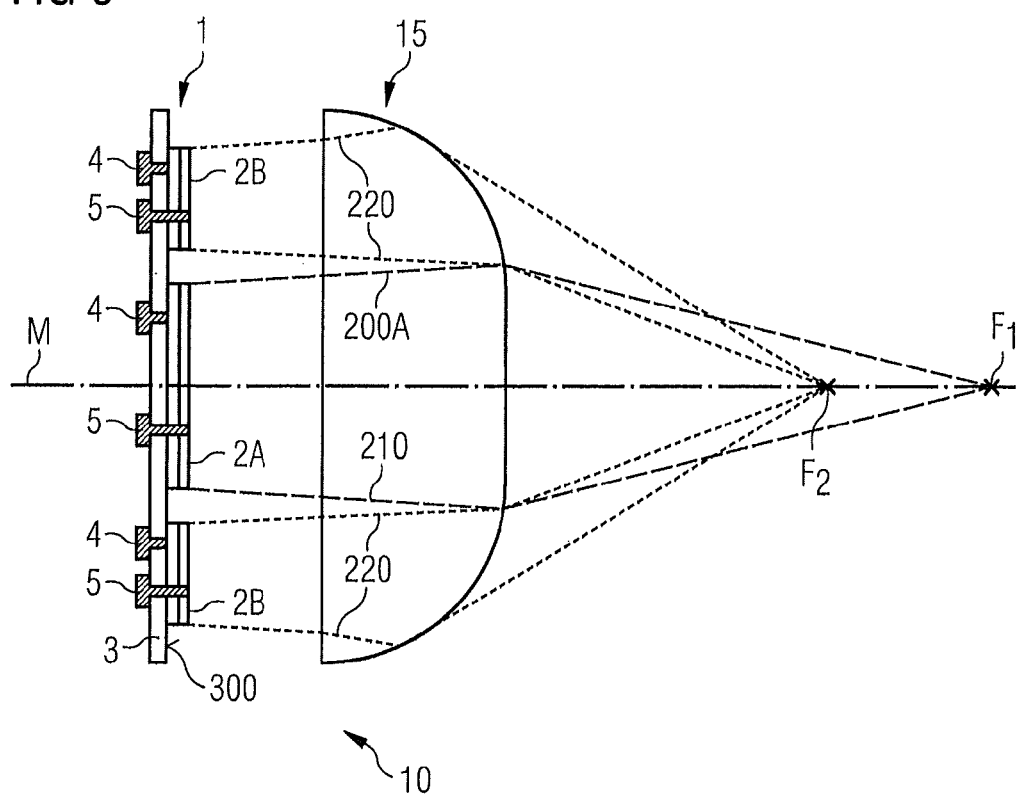
FIG. 6 shows a schematic cross section through an illumination device for a camera in accordance with a first example.

FIG. 6 shows a schematic cross section through an illumination device in accordance with a first example.

The illumination device 10 comprises a light-emitting semiconductor chip 1 and an optical element 15. The optical element 15 can comprise a free-form lens, for example. The light-emitting semiconductor chip 1 can be, for example, one of the semiconductor chips in accordance with one of the previous examples.

For example, the illumination device 10 in the case of the first example is illustrated with the semiconductor chip in accordance with FIG. 5B. However, the arrangement of the emission regions 2, 2A, 2B, 2B' is not restricted to this example, but rather can be chosen, for example, in accordance with one of the other examples of the semiconductor chip 1. In the present case, the semiconductor chip 1 is provided for rear-side external electrical connection by the electrode connection regions 4, 5 arranged at a side of the carrier 3 remote from the emission regions 2A, 2B. However, the semiconductor chip can also be provided for front-side external electrical connection, as explained in association with the first three examples of the semiconductor chip 1. In this case, the electrode connection regions 4, 5 are not formed at the rear side of the carrier body 3, but rather on the front-side main area 300. In this case, a separate anode connection 5 and a separate cathode connection 4 are provided for each emission region 2A, 2B. However, the emission regions can also be connected in parallel or in series as explained in association with FIGS. 2 to 4.

In the case of the first example, the illumination device has the shape of the free-form lens 15 and the arrangement thereof with respect to the semiconductor chip 1 such that light (indicated by the dashed lines 210 in FIG. 6), emitted by the first emission region 2A is focussed at a first focal point $F_1$. Light (indicated by the dotted lines 220 in FIG. 6) emitted by the further emission regions 2B is focussed at a second focal point $F_2$ arranged on an optical axis of the lens 15 between the first focal point $F_1$ and the semiconductor chip 1.

The focal point of the beam of rays coupled out from the illumination device 10 can be set in this way. For example, the illumination device 10 can be driven for operation with a first beam profile such that the first emission region 2A emits light and the further emission regions 2B are turned off. In this case, a beam of rays is coupled out from the illumination device 10, and is focussed at the first focal point $F_1$.

Figure 7:
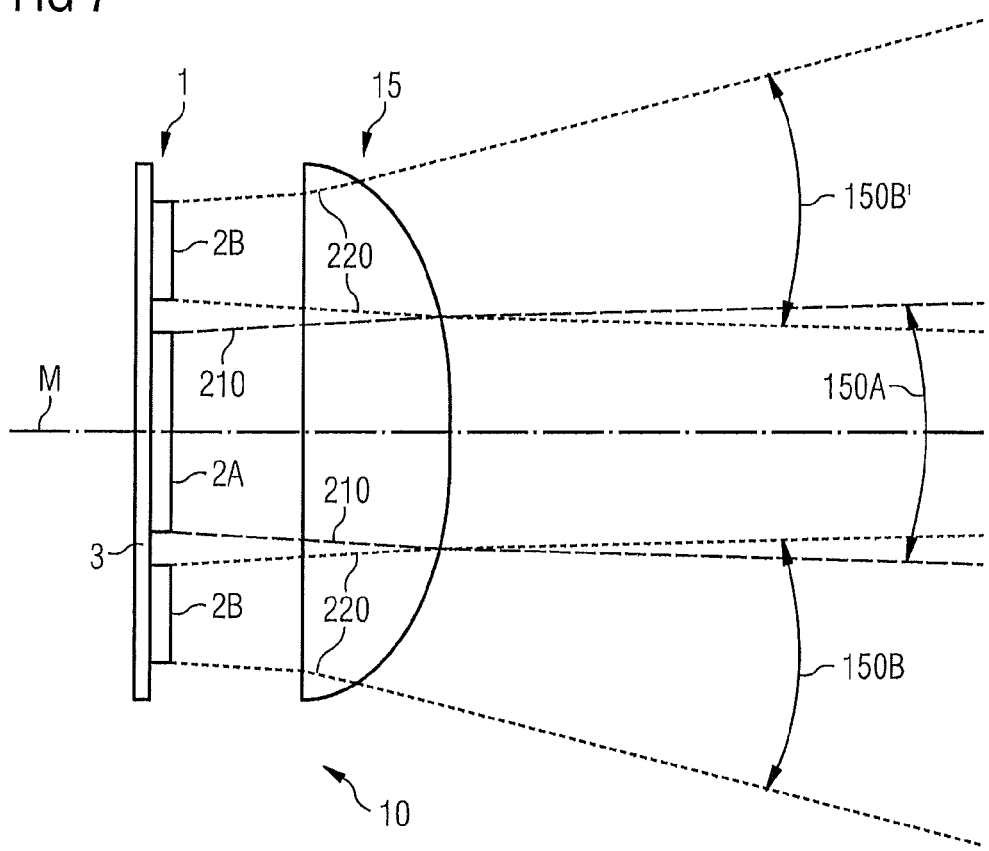
FIG. 7 shows a schematic cross section through an illumination device for a camera in accordance with a second example.

For operation with a second beam profile, the illumination device 10 can be driven such that the first emission region 2A is turned off and the further emission regions 2B emit light 220. In this case, a beam of rays is coupled out from the illumination device, and is focussed at the second focal point F2. FIG. 7 shows a schematic cross section through an illumination device in accordance with a second example. The electrical interconnection of the emission regions 2A, 2B with the conductor tracks 6 and the electrode connection regions 4, 5 is not illustrated in FIG. 7 for the sake of clarity.

The illumination device 10 in accordance with the second example differs from the illumination device in accordance with the first example in that it is designed for emitting a divergent beam of rays. With the individually drivable emission regions 2A, 2B, the aperture angle of the beam of rays coupled out from the illumination device 10 can be set.

As in the previous example, the optical element 15 is, for example, a lens that is stationary with respect to the semiconductor chip 1, in particular a free-form lens. However, the shaping and arrangement of the lens 15 are chosen such that the illumination device in accordance with the example in FIG. 7 is designed to direct light 210 emitted by the first emission region 200 into a first emission angle range 150A. The illumination device 10 is furthermore designed, by shaping the lens and the arrangement thereof with respect to the emission regions 2A, 2B, to direct light 220 emitted by the further emission regions 2B into second emission angle ranges 150B, 150B'.

The first emission angle range contains a central axis M of the beam of rays. The central axis M coincides, in particular, with the optical axis of the optical element 15. The second emission angle ranges are spaced apart from the central axis M of the beam of rays.

With the individually drivable emission regions 2A, 2B, the aperture angle of the beam of rays coupled out from the illumination device 10 can be set in this way. If only the first emission region 2A is operated for the purpose of generating a first beam profile, the beam of rays has a comparatively small aperture angle. If all the emission regions 2A, 2B are operated for the purpose of generating a second beam profile, the aperture angle of the beam of rays is increased in comparison with operation with the first beam profile.

Figure 8A:
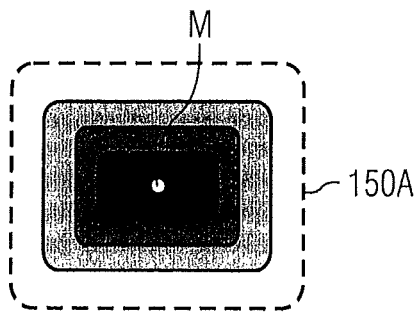
FIG. 8A shows a schematic illustration of the intensity distribution of a first beam profile.
Figure 8B:
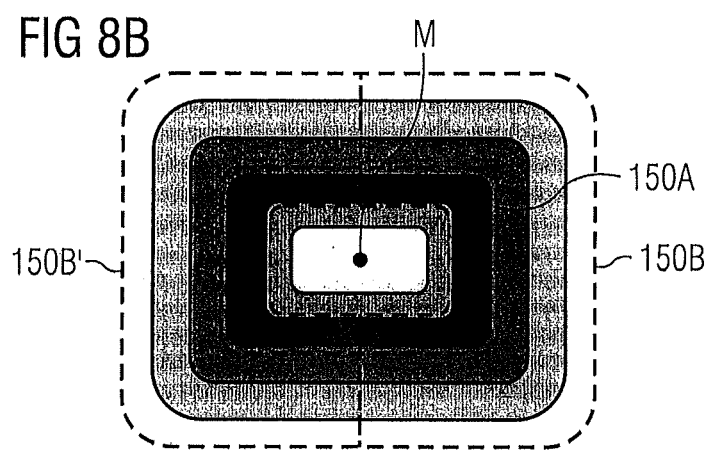
FIG. 8B shows a schematic illustration of the intensity distribution of a second beam profile.

FIGS. 8A and 8B schematically illustrate the first and the second beam profile in a plane perpendicular to the central axis M. In this case, FIGS. 8A and 8B each show the location-dependent relative radiation intensity in the plane relative to the maximum radiation intensity of the respective beam profile. In FIGS. 8A and 8B, dark grey shades correspond to a higher radiation intensity than light grey shades.

In the case of the first beam profile, the maximum of the radiation intensity lies on the central axis. Proceeding from the central axis, the radiation intensity falls continuously, for example, in every direction perpendicular to the central axis M. Outside the first emission angle range, substantially no radiation is emitted. For example, outside the first emission angle range, the intensity has fallen to $1/e^2$ of the intensity maximum. In the plane illustrated in FIGS. 8A and 8B, the first emission angle range corresponds to the region enclosed by the dashed line 150A.

The second beam profile, illustrated schematically in FIG. 8B, does not have a maximum, but rather a local minimum of the radiation intensity on the central axis M. By contrast, the intensity maximum of the radiation intensity is contained in a ring-shaped region extending around the central axis. For example, the intensity maximum is arranged in a ring-shaped overlap region of the first emission angle range 150A and of the second emission angle ranges 150B, 150B'. In the plane illustrated in FIG. 8B, the second emission angle ranges correspond to the regions enclosed by the dashed-dotted lines 150B and 150B'. Proceeding from the central axis M, the radiation intensity, in every direction perpendicular to the central axis, rises up to the intensity maximum in the overlap region and subsequently falls again in a direction away from the central axis M until it has fallen to $1/e^2$ of the intensity maximum, for example, at the outer contour of the second emission range.

Figure 9:
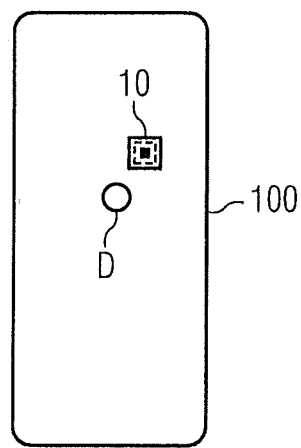
FIG. 9 shows a schematic plan view of a mobile telephone.

FIG. 9 shows a mobile telephone 100, which contains a camera with a CCD detector D for recording images and an illumination device 10, for example, in accordance with any of the preceding examples. The camera can be a photographic camera and/or a video camera. The illumination device can be used, for example, as pre-flash and main flash for recording an image and/or for recording an image sequence with different beam profiles, as explained above.

Our devices and methods are not restricted to the examples by the description on the basis thereof. Rather, this disclosure encompasses any novel feature and also any combination of features, even if the feature or combination is not explicitly described in the examples or the appended claims.

The invention claimed is:

1. An illumination device for a camera comprising a light-emitting semiconductor chip comprising a plurality of individually drivable emission regions and an optical element (15) that shapes light emitted by the emission regions to form a beam of rays, wherein different beam profiles of the beam of rays can be set by the individually drivable emission regions.

2. The illumination device according to claim 1, wherein the beam profiles differ with regard to a spatial intensity distribution and/or a spatial chromaticity coordinate distribution in a plane perpendicular to a central axis (M) of the beam of rays.

3. The illumination device according to claim 1, wherein an aperture angle of the beam of rays can be set by the individually drivable emission regions.

4. The illumination device according to claim 1, wherein a position of a focal point ($F_1$, $F_2$) to which the beam of rays is focussed by the optical element can be set by the individually drivable emission regions.

5. The illumination device according to claim 1, wherein, with the individually drivable emission regions, a first beam profile can be set such that the radiation intensity has a local minimum on a central axis (M) of the beam of rays and rises and subsequently falls again in at least one direction perpendicular to the central axis (M) in a direction away from the central axis (M), and a second beam profile can be set such that the radiation intensity has an intensity maximum on the central axis (M) and falls in every direction perpendicular to the central axis (M) proceeding from the central axis (M).

6. The illumination device according to claim 1, wherein at least two of the emission regions differ with regard to a chromaticity coordinate of the light emitted by the respective emission region.

7. The illumination device according to claim 1, wherein
each emission region has an emission area for coupling-out of light at a front side of the semiconductor chip,
each emission region is assigned two conductor tracks of the semiconductor chip for electrical connection of the respective emission region, and
the respective emission area covers the two assigned conductor tracks in a plan view of the front side.

8. The illumination device according to claim 1, wherein the semiconductor chip has two external connection zones which can be electrically conductively connected to bridge one of the emission regions.

9. The illumination device according to claim 8, comprising a control unit that produces an electrically conductive connection between the two external connection zones to set a first beam profile and interrupt the electrically conductive connection to set a second beam profile.

10. The illumination device according to claim 1, wherein an emission region is laterally enclosed by at least one further emission region.

11. A flashlight comprising the illumination device according to claim 1.

12. A camera that records images and/or image sequences comprising an illumination device according to claim 1.

13. A method for operating the illumination device according to claim 1, comprising operating the illumination device with a first beam profile and subsequently with a second beam profile different from the first beam profile, wherein the emission regions are driven such that, during operation with the first beam profile, a first emission region emits light and a second emission region is turned off and, during operation with the second beam profile, the second emission region emits light and the first emission region emits light or is turned off.

14. The method according to claim 12 which records an image sequence, comprising:
operating the illumination device with a first beam profile and subsequently with a second beam profile different from the first beam profile, wherein
the emission regions are driven such that, during operation with the first beam profile, a first emission region emits light and a second emission region is turned off and during operation with the second beam profile, the second emission region emits light and the first emission region emits light or is turned off, and
the camera records a first image while the illumination device is operated with the first beam profile, and records a second image while the illumination device is operated with the second beam profile.

15. The method according to claim 12 which records an image, comprising:
operating the illumination device with a first beam profile and subsequently with a second beam profile different from the first beam profile, wherein
the emission regions are driven such that, during operation with the first beam profile, a first emission region emits light and a second emission region is turned off and, during operation with the second beam profile, the second emission region emits light and the first emission region emits light or is turned off,
the camera has a detector (D) that detects the image and a release mechanism that starts the recording, and
comprise the following steps in the order indicated:
1) actuating the release mechanism for a time shift triggering of the detection of the image by the detector (D);
2) operating the illumination device with the first beam profile before the detection of the image by the detector (D); and
3) operating the illumination device with the second beam profile during the detection of the image by the detector (D).

16. An illumination device for a camera comprising:
a light-emitting semiconductor chip and an optical element, wherein
the semiconductor chip has a semiconductor layer sequence containing an active zone provided to generate light and an electrical contact on the semiconductor layer sequence,
the light-emitting semiconductor chip has a plurality of individually drivable emission regions,
the emission regions are defined by a structuring of at least one of the electrical contact and the semiconductor layer sequence,
the optical element shapes light emitted by the emission regions to form a beam of rays, and
the illumination device sets different beam profiles of the beam of rays by the individually drivable emission regions.

* * * * *

UNITED STATES PATENT AND TRADEMARK OFFICE
CERTIFICATE OF CORRECTION

PATENT NO.           : 8,577,218 B2
APPLICATION NO.      : 13/496920
DATED                : November 5, 2013
INVENTOR(S)          : von Malm et al.

It is certified that error appears in the above-identified patent and that said Letters Patent is hereby corrected as shown below:

In the Claims

In Column 14

In claim 1, line 53, delete "(15)";

In claim 2, line 59, delete "(M)"; and

In claim 4, line 65, delete "($F_1$, $F_2$)".

In Column 15

In claim 5, line 4, delete "(M)"; at line 6, delete "(M)"; at line 7, delete "(M)"; at line 9, delete "(M)"; and at line 10, delete "(M)" at both occurrences.

In Column 16

In claim 15, at line 23, delete "(D)"; at line 28, delete "(D)"; at line 31, delete "(D)"; and at line 34, delete "(D)".

Signed and Sealed this
Fourth Day of February, 2014

Michelle K. Lee
*Deputy Director of the United States Patent and Trademark Office*